(12) United States Patent
Chan et al.

(10) Patent No.: US 7,436,169 B2
(45) Date of Patent: Oct. 14, 2008

(54) MECHANICAL STRESS CHARACTERIZATION IN SEMICONDUCTOR DEVICE

(75) Inventors: Victor Chan, Newburgh, NY (US); Khee Yong Lim, Singapore (SG)

(73) Assignee: International Business Machines Corporation, Armonk, NY (US)

( * ) Notice: Subject to any disclaimer, the term of this patent is extended or adjusted under 35 U.S.C. 154(b) by 498 days.

(21) Appl. No.: 11/162,295

(22) Filed: Sep. 6, 2005

(65) Prior Publication Data

US 2007/0056380 A1    Mar. 15, 2007

(51) Int. Cl.
   *G01R 31/28* (2006.01)
(52) U.S. Cl. ............... 324/158.1; 324/768; 324/769; 702/82
(58) Field of Classification Search ......... 324/763–765, 324/158.1; 702/82
   See application file for complete search history.

(56) References Cited

U.S. PATENT DOCUMENTS

| | | | |
|---|---|---|---|
| 6,134,971 A | 10/2000 | Misra et al. | |
| 6,678,055 B2 | 1/2004 | Du-Nour et al. | |
| 6,879,177 B1 * | 4/2005 | Bolam et al. | 324/765 |
| 7,116,125 B2 * | 10/2006 | Kim | 324/765 |
| 7,132,317 B2 * | 11/2006 | Arao | 438/154 |
| 2004/0104405 A1 * | 6/2004 | Huang et al. | 257/199 |
| 2005/0280477 A1 * | 12/2005 | Reddy et al. | 331/57 |

* cited by examiner

*Primary Examiner*—Ha Nguyen
*Assistant Examiner*—Richard Isla Rodas
(74) *Attorney, Agent, or Firm*—Rosa Yaghmour; Hoffman Warnick (57) ABSTRACT

Methods of characterizing a mechanical stress level in a stressed layer of a transistor and a mechanical stress characterizing test structure are disclosed. In one embodiment, the test structure includes a first test transistor including a first stress level; and at least one second test transistor having a substantially different second stress level. A testing circuit can then be used to characterize the mechanical stress level by comparing performance of the first test transistor and the at least one second test transistor. The type of test structure depends on the integration scheme used. In one embodiment, at least one second test transistor is provided with a substantially neutral stress level and/or an opposite stress level from the first stress level. The substantially neutral stress level may be provided by either rotating the transistor, removing the stressed layer causing the stress level or de-stressing the stressed layer causing the stress layer.

2 Claims, 11 Drawing Sheets

MECHANICAL STRESS CHARACTERIZATION IN SEMICONDUCTOR DEVICE

BACKGROUND OF THE INVENTION

1. Technical Field

The present invention relates generally to semiconductor device testing, and more particularly, to methods of characterizing a mechanical stress level in a stressed layer of a transistor and a mechanical stress characterizing test structure.

2. Related Art

The application of stresses to field effect transistors (FETs) is known to improve their performance. When applied in a longitudinal direction (i.e., in the direction of current flow), tensile stress is known to enhance electron mobility (or n-channel FET (NFET) drive currents) while compressive stress is known to enhance hole mobility (or p-channel FET (PFET) drive currents). One way to apply such stresses to a FET is the use of intrinsically-stressed barrier silicon nitride layers. For example, a tensile-stressed silicon nitride layer may be used to cause tension in an NFET channel while a compressively-stressed silicon nitride layer may be used to cause compression in a PFET channel. In some instances, dual stressed layers may be used, and in others a single stressed layer may be used. In any event, the stressed layer(s) modulate on-off current ($I_{on}$-$I_{off}$) performance.

In order to achieve the benefits of the above-described technology, correct characterization of mechanical stress under a device is very important. Conventionally, inline blanket wafer stress characterization through physical bending is used. However, this approach cannot accurately reflect the mechanical stress under a transistor channel.

In view of the foregoing, there is a need in the art for a solution to provide for improved mechanical stress characterization.

SUMMARY OF THE INVENTION

Methods of characterizing a mechanical stress level in a stressed layer of a transistor and a mechanical stress characterizing test structure are disclosed. In one embodiment, the test structure includes a first test transistor including a first stress level; and at least one second test transistor having a substantially different second stress level. A testing circuit can then be used to characterize the mechanical stress level by comparing performance of the first test transistor and the at least one second test transistor. The type of test structure depends on the integration scheme used. In one embodiment, at least one second test transistor is provided with a substantially neutral stress level and/or an opposite stress level from the first stress level. The substantially neutral stress level may be provided by either rotating the transistor, removing the stressed layer causing the stress level or de-stressing the stressed layer causing the stress layer.

A first aspect of the invention is directed to a mechanical stress characterizing test structure comprising: a first test transistor including a first stress level; and at least one second test transistor having a substantially different second stress level from the first stress level.

A second aspect of the invention includes a method of characterizing a mechanical stress level in a stressed layer of a transistor, the method comprising the steps of: providing a first test transistor having a first stress level and at least one second test transistor having a second stress level substantially different than the first stress level; and characterizing the mechanical stress level by comparing performance of the first test transistor and the at least one second test transistor.

A third aspect of the invention related to a mechanical stress characterizing test structure comprising: a first test transistor including a first stressed layer having one of a compressive stress level and a tensile stress level; a second test transistor having a substantially neutral stress level; and means for testing the first and second transistors based on their different stress levels.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

Figure 1:
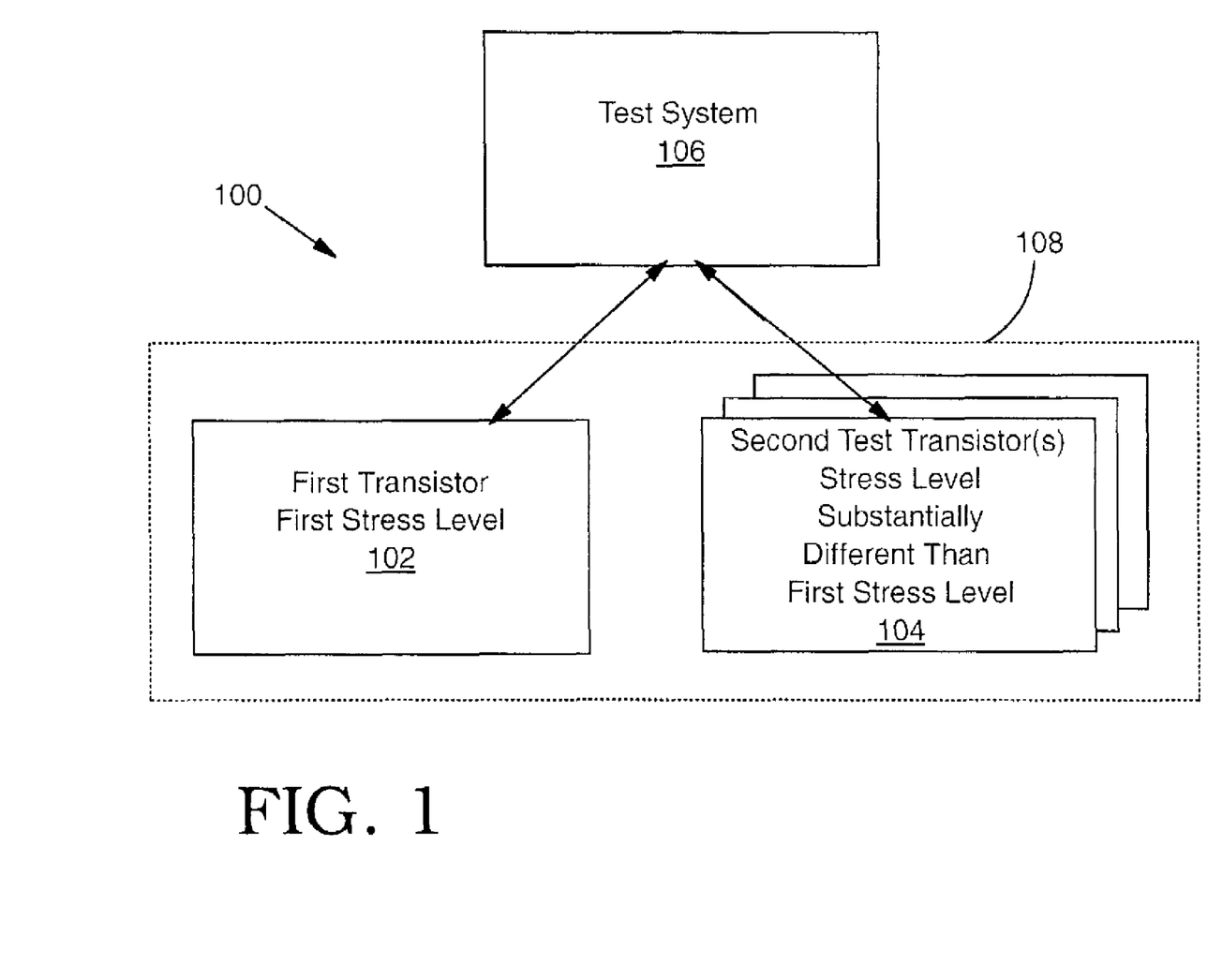
FIG. 1 shows a general schematic overview of a test structure according to one embodiment of the invention.

With reference to the accompanying drawings, FIG. 1 shows a general schematic overview of one embodiment of the invention. In particular, the invention includes a mechanical stress characterizing test structure 100 (hereinafter "test structure 100") including a first test transistor 102 including a first stress level, and at least one second test transistor 104 having a substantially different second stress level from the first stress level. As used herein, 'substantially different stress level' indicates a stress level sufficient to cause a discernible performance difference. Test structure 100 may also include a test system 106 for testing first and second test transistors 102, 104. Collectively, first and second transistors 102, 104 may be referred to as 'transistor section 108' of test structure 100. Test system 106 includes any now known or later developed circuitry or structure for testing the first and second transistors based on their different stress levels. As will be described below, the testing can be based on different electrical parameters. In any case, the testing includes comparing performance of first test transistor 102 and the at least one second test transistor 104, as represented by the particular electrical parameters chosen.

The type of test structure 100 may vary depending on the integration scheme used. In any event, each of first and second test transistors 102, 104 are preferably of the same type, i.e., NFET or PFET.

Figure 2:
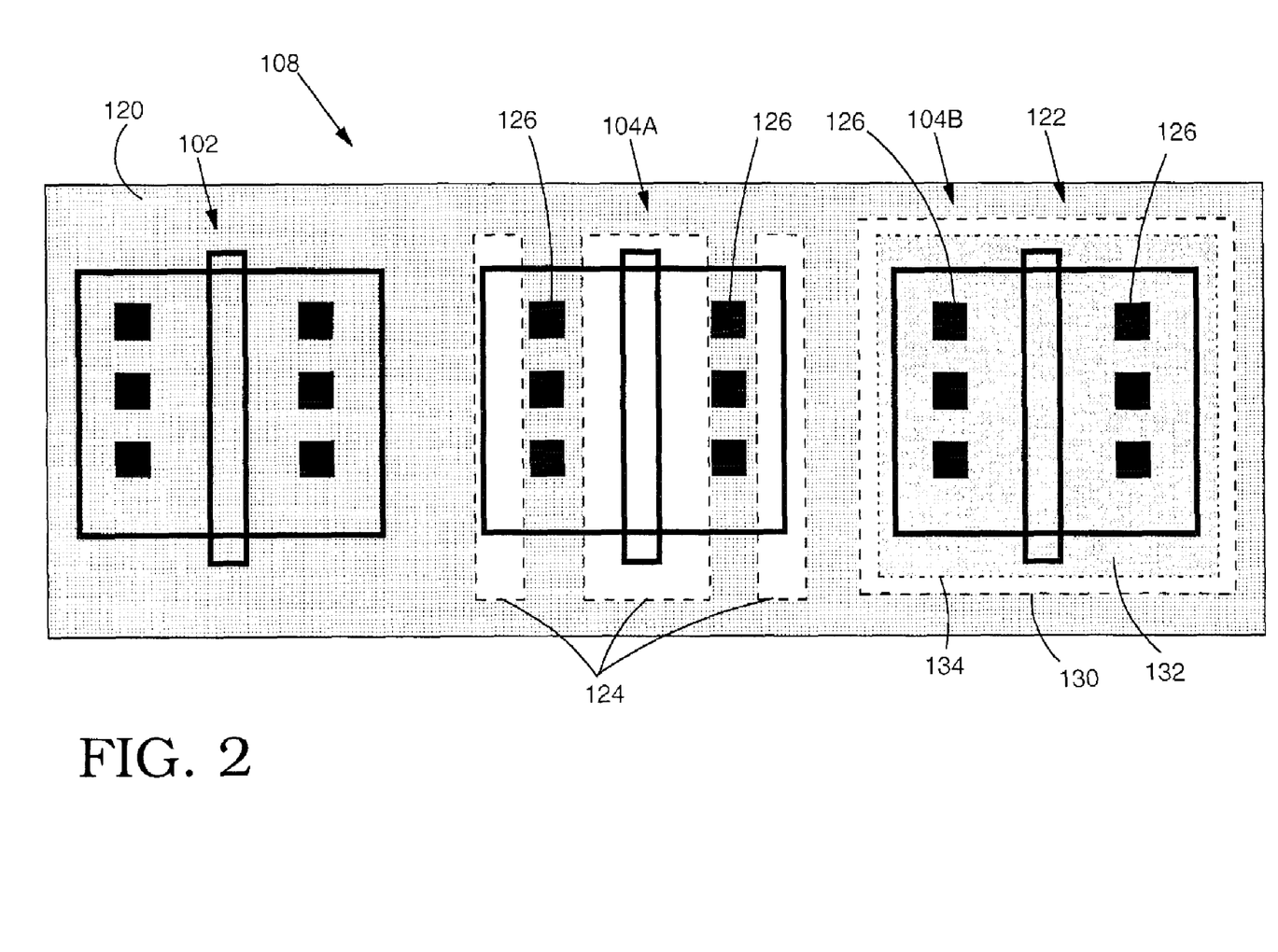
FIG. 2 shows a transistor section according to a first embodiment of the invention.

Turning to FIG. 2, a first embodiment of transistor section 108 of test structure 100 will now be described. This particular embodiment is advantageous for integration schemes that use a dual stress layer, i.e., a compressive layer and tensile layer are deposited during processing. In this case, first test transistor 102 and the at least one second test transistor 104A, 104B are formed including a first stressed layer 120 thereover. It should be recognized that while two second test transistors 104A, 104B are shown (referred to as third and fourth), only one or more than two may also be included. First stressed layer 120 imparts the first stress level. For example, if test transistors 102, 104A, 104B were NFETS, first stressed layer may impart a tensile stress. First stressed layer 120 is removed (as shown within dashed boxes 124) from the at least one second test transistor 104A, except at contacts 126 of the at least one second test transistor 104A. The removal step may be performed by any now known or later developed patterning and etching process. In this case, the second test transistor 104A has a substantially neutral stress level, which can be tested versus first transistor 102 by comparing their performances. As used herein, 'substantially neutral' means very little or no stress.

With continuing reference to FIG. 2, transistor section 108 may also include first transistor 102 having a first stress level, second test transistor 104A having a substantially neutral stress level, as described above, and another second test transistor 104B having a second stress level. In terms of second test transistor 104B, first stressed layer 120 may be removed, as described above and as shown by dashed box 130, and a second stressed layer 132 having a second stress level may be deposited where first stressed layer 120 is removed, as shown by dashed box 134. In contrast to second test transistor 104A, first stressed layer 120 is completely removed from contacts 126. The removal step may be performed by any now known or later developed patterning and etching process. In one embodiment, second stressed layer 132 has a substantially opposite stress level as that of the first stress level, i.e., on an opposite side of zero stress from the first stress level. For example, if first stress level is tensile, second stress level would be compressive. (Note, boxes 130 and 134 are shown in a non-overlapping position for clarity—typically they would be coincident). The above-described processing may be provided as part of the typical dual stress layer formation processing for other operative transistors (not shown).

Figure 3:
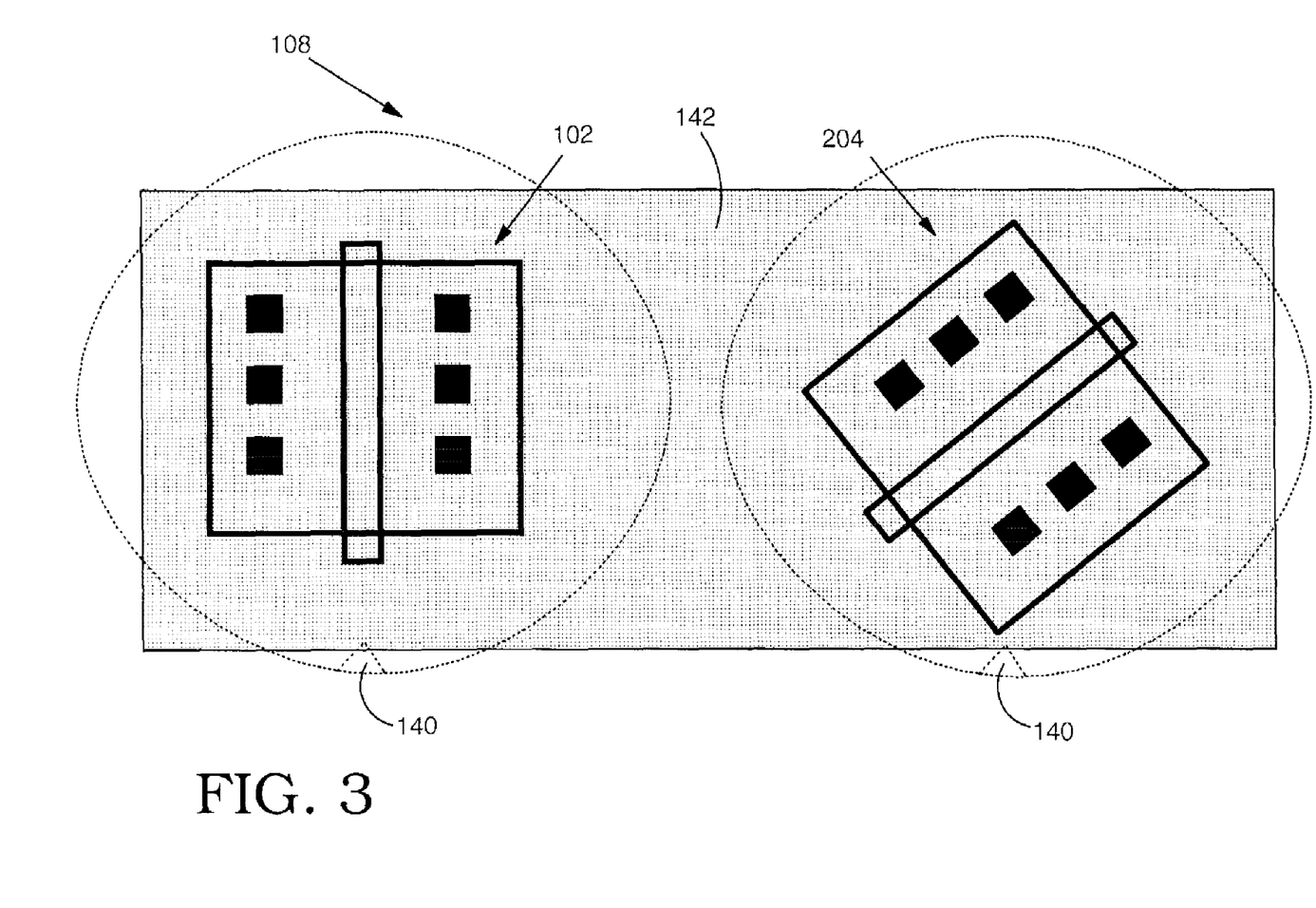
FIG. 3 shows a transistor section according to a second embodiment of the invention.

Turning to FIG. 3, a second alternative embodiment of the invention will now be described. This particular embodiment is advantageous for technologies without a selective etch or implantation of contact etch-stop layer processes, or for technologies with a wafer notch 140 (shown in phantom) with a single contact stress layer. As shown in FIG. 3, this embodiment includes providing first transistor 102 in a conventional position, but positioning at least one second test transistor 204 at approximately 45° relative to first test transistor 102. For example, second transistor 204 may include a PFET rotated by approximately 45° in a (100) wafer (shown in phantom), which will exhibit substantially neutral stress. Zero degree (0°) indicates carrier flow in a [110] channel, and 45° indicates carrier flow in the [100] direction. The same stressed layer 142 is then deposited over both test transistors 102, 204. Other than the rotated position, the test transistors are substantially identical. This embodiment, although not shown, can also incorporate a test transistor at 0 degrees rotation having a stressed layer opposite that of first test transistor 102, which would be formed similarly to test transistor 104B in FIG. 2.

Figure 4:
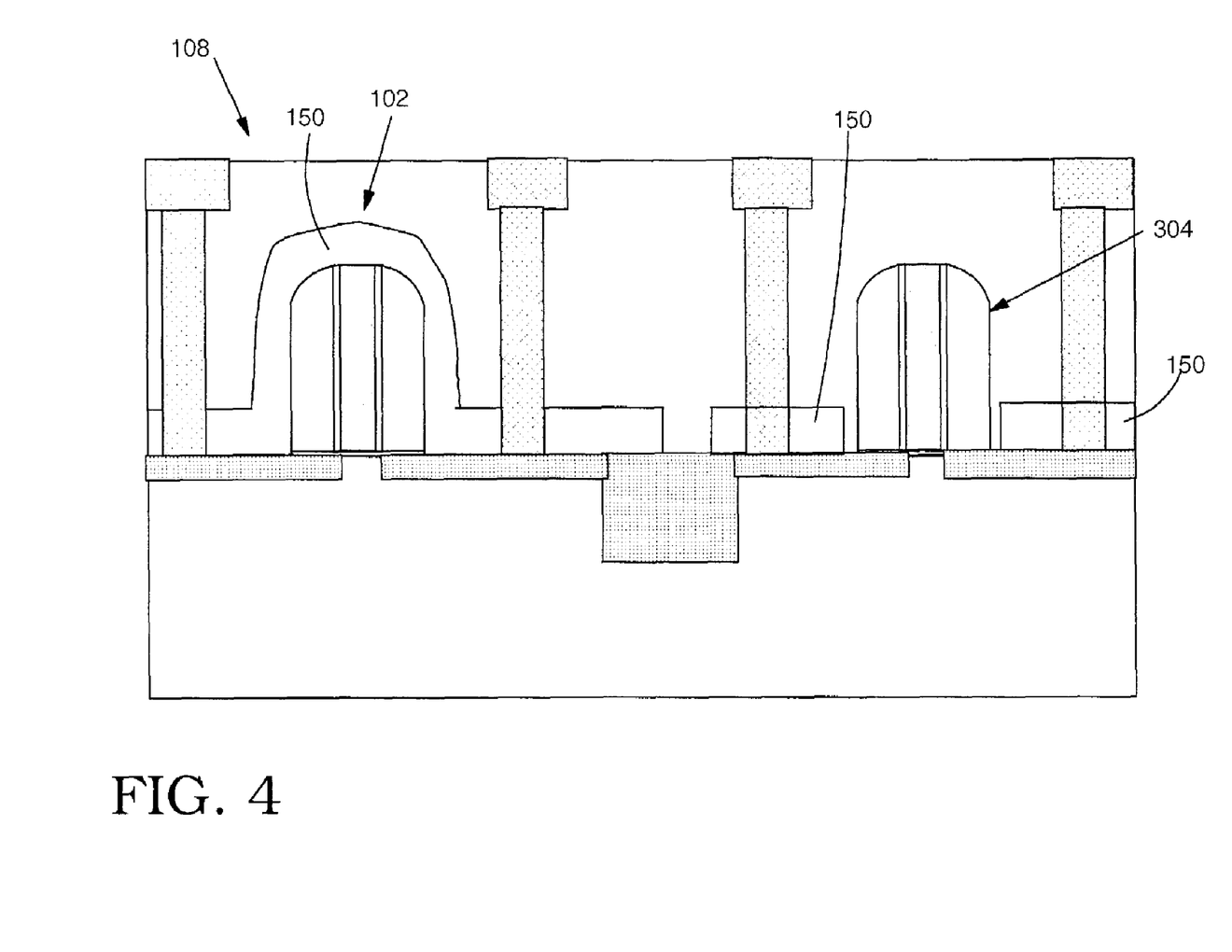
FIG. 4 shows a transistor section according to a third embodiment of the invention.
Figure 5:
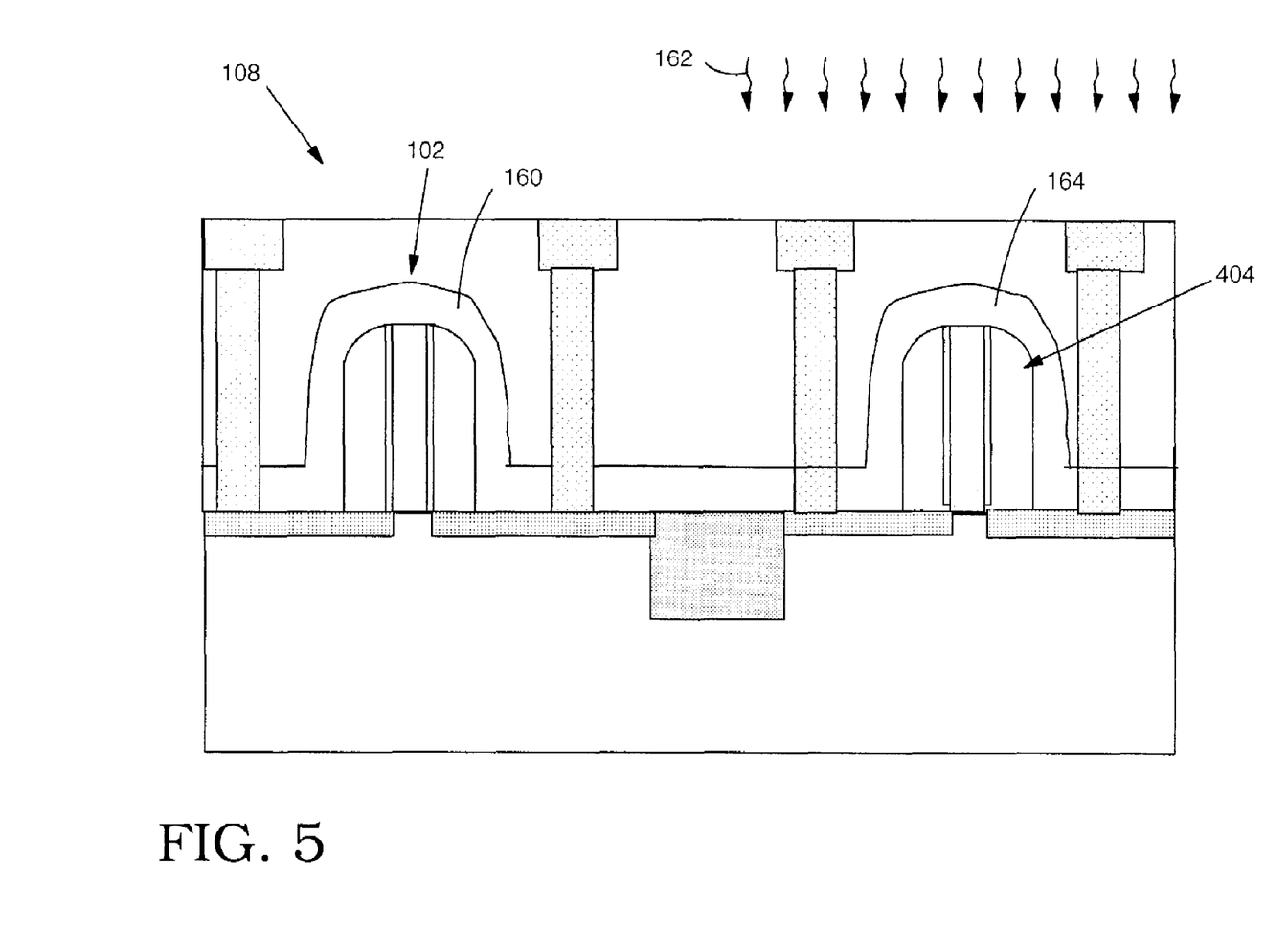
FIG. 5 shows a transistor section according to a fourth embodiment of the invention.

Turning to FIGS. 4-5, a third and fourth embodiment of the invention will now be described. These embodiments are advantageous for integration schemes implementing only a single stressed layer. Referring to FIG. 4, one of these embodiments includes forming test transistors 102, 304 with a first stressed layer 150 that imparts the first stress level, and then removing first stressed layer 150 of the at least one second test transistor 304. The removal of first stressed layer 150 may occur at any convenient point during processing, but prior to the finishing of the device, as shown. FIG. 5 shows another alternative embodiment for only a single stressed layer integration schemes that also implements a germanium or xenon implant. In this embodiment, as shown in FIG. 5, test transistors 102, 404 are formed with a first stressed layer 160 that imparts the first stress level, and first stressed layer 160 of the at least one second test transistor 404 is de-stressed (i.e., to have a stress level substantially different than first stress level) by implanting 162 germanium (Ge) or xenon (Xe). A de-stressed layer 164 including germanium or xenon is thus formed over second test transistor 404. It should be recognized that the amount of de-stressing is dependent on the variation and uniformity in the implant dose and energy, and therefore should be monitored carefully.

It should be recognized that the actual value of stress level for the described above embodiments will vary depending on the type of test transistor being tested. It should also be recognized that the type of test transistor section 108 used will vary depending on the integration scheme. The number of each type of test transistor within each transistor section 108 may also vary.

Turning to FIGS. 6-11, characterization of mechanical stress by comparing performance of first test transistor 102 and the at least one second test transistor, as represented by particular electrical parameters, will now be described. The characterization may be carried, for example, by any hardware and/or software combination or general use computer implemented as part of, or communicative with, test system 106. The type of testing performed, and thus electrical parameters measured, by testing system 106 may vary depending on the types of transistor section 108 used and other variables. In one embodiment, however, testing system 106 is configured to perform one of: 1) comparing on-current ($I_{on}$) versus off-current ($I_{off}$) of first test transistor 102 and the at least one second test transistor, 2) comparing overdrive linear current ($I_{odlin}$) of first test transistor 102 and the at least one second test transistor, and 3) comparing linear current ($I_{dlin}$) versus linear threshold voltage ($Vt_{lin}$) of first test transistor 102 and the at least one second test transistor. It is recognized that different stress levels generate different on-current ($I_{on}$) at the same off-current ($I_{off}$). On-current ($I_{on}$)=$I_d$ at $V_d$=1V $V_{dd}$, $V_g$=1V and $V_s$=0V; and off-current ($I_{off}$)=$I_d$ at $V_d$=$V_{dd}$, $V_g$=0V and $V_s$=0V, where $V_{dd}$ is the supply voltage, e.g., at 1V. $I_{odlin}$=$I_d$ at $V_d$=0.05V, $V_g$=0.5V+$Vt_{lin}$ and $V_s$=0V, where $Vt_{lin}$=linear threshold voltage with $V_d$=0.05V and $V_s$=0V. $I_{dlin}$=$I_d$ at $V_d$=0.05V and $V_s$=0V. $Vt_{lin}$=Vt at $V_d$=0.05 and $V_s$=0V.

Figure 6:
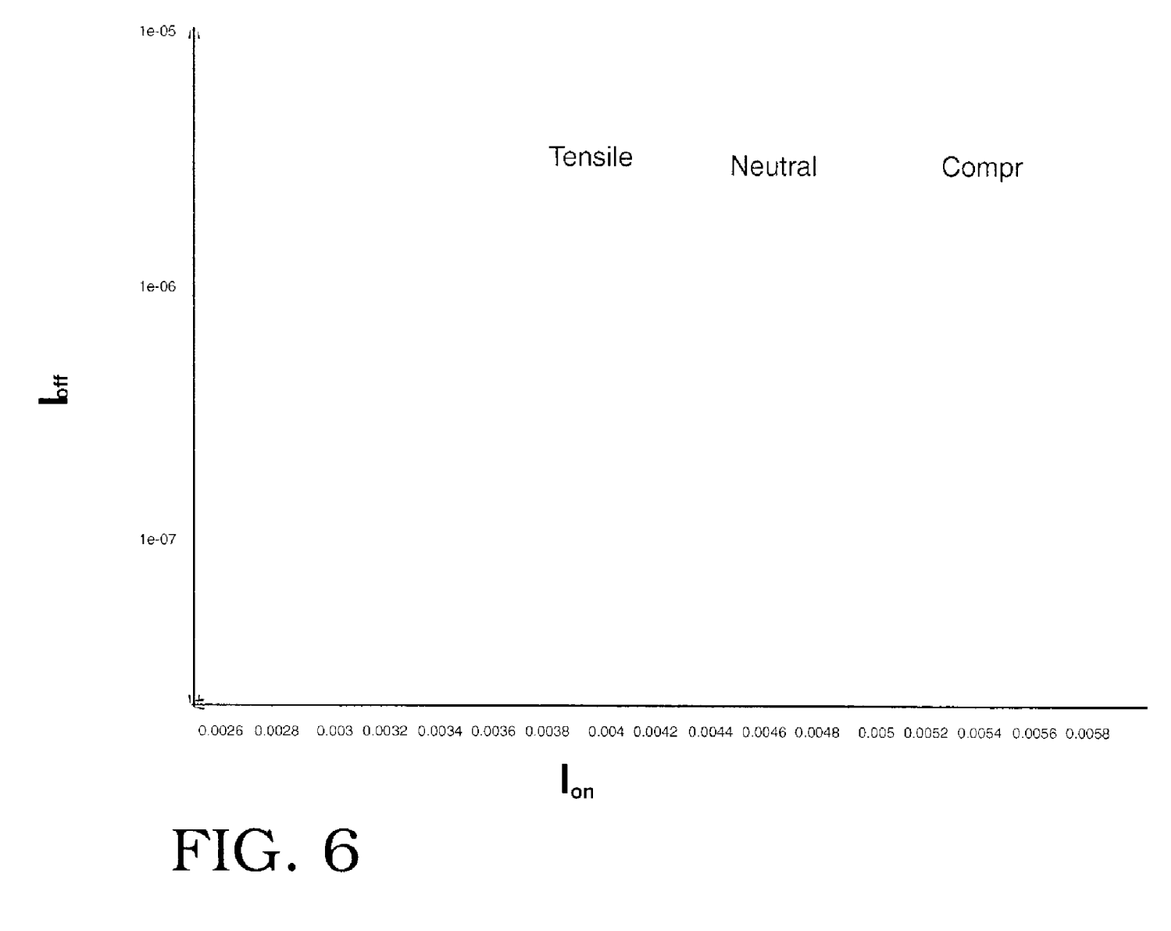
FIGS. 6-11 show graphs illustrating different techniques for analyzing testing data generated according to the various embodiments of the invention.
Figure 7:
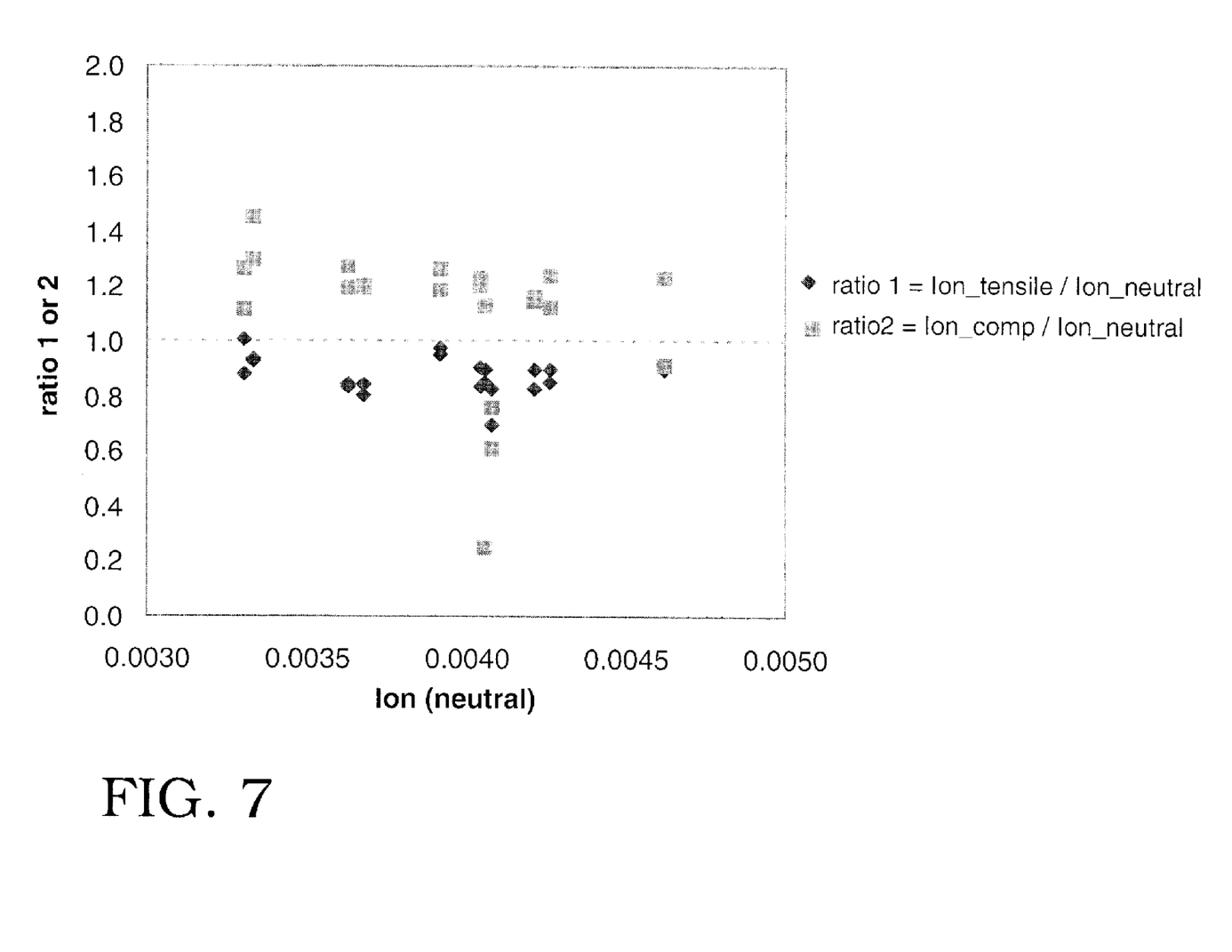

For the embodiment of FIG. 2, the various currents of stressed test transistors 102, 104B can be compared to a zero stress, test transistor current, i.e., that of second transistor 104A. For example, FIG. 6 shows a chart indicating three different on-currents ($I_{on}$) for three test transistors having three different stress levels, i.e., different stressed layers. FIG. 7 shows ratios of on-current for a tensile stress level (Ion_tensile) to on-current for a neutral stress (Ion_neutral) (ratio 1) and on-current for a compressive stress level (Ion_comp) to Ion_neutral (ratio 2), based on FIG. 6. Ratios 1 and 2 can be used to monitor the stress level of a dual stress layer structure to determine the reliability and uniformity, e.g., lot-to-lot uniformity or within lot or within wafer uniformity. In particular, using ratios 1 and 2, any on-current ($I_{on}$) drift can be used to determine whether the drift is from the stress level (ratio 1 or ratio 2) of the stressed layers or from other fabrication processes.

Figure 8:
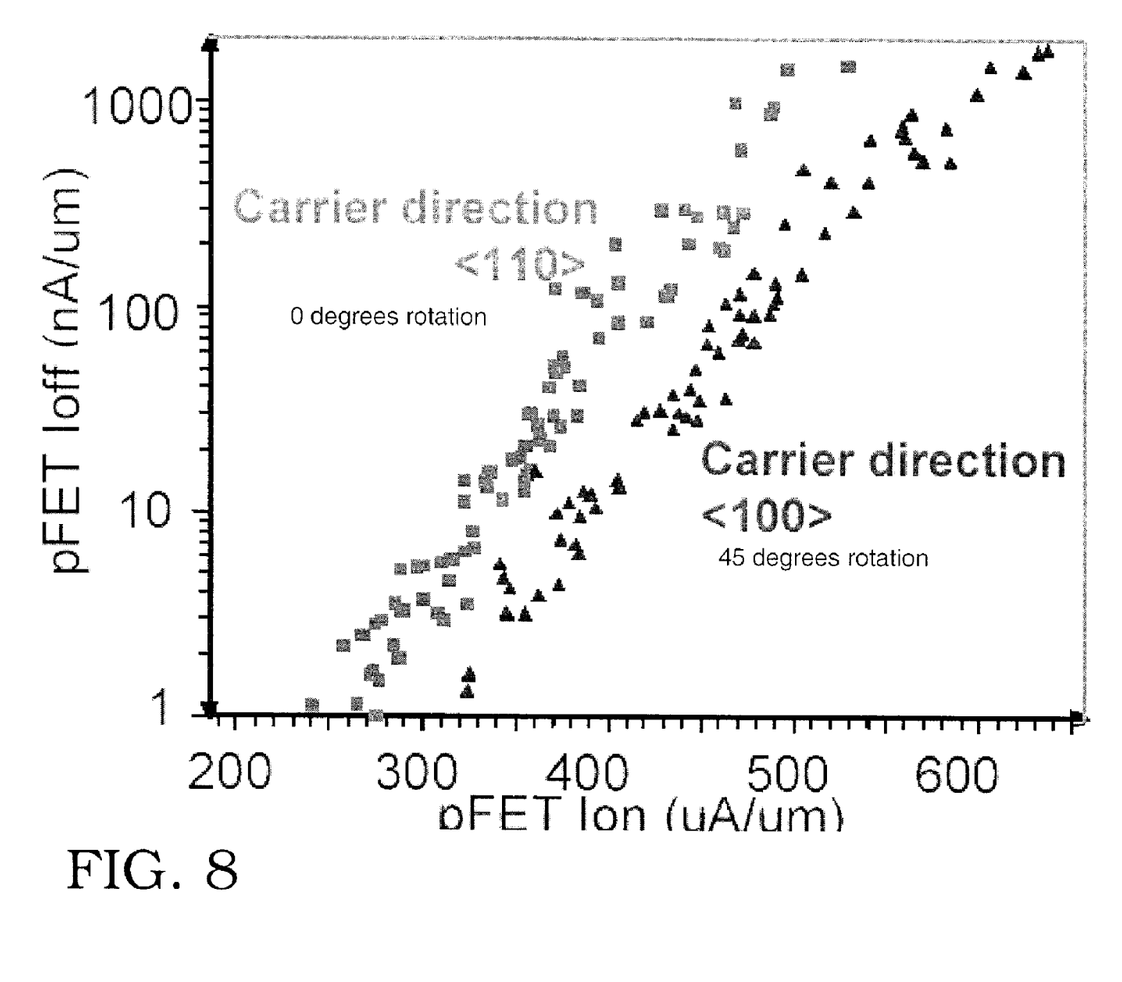
Figure 9:
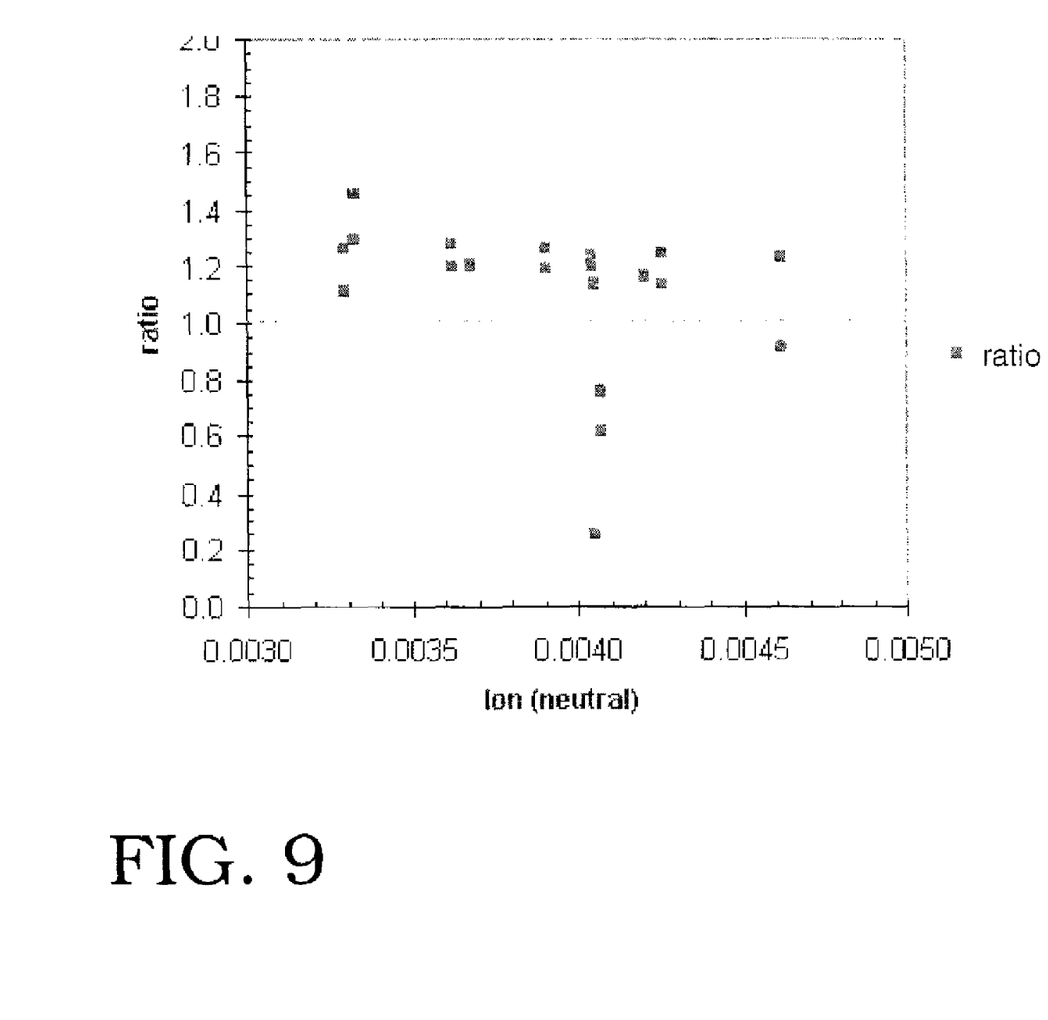

For the embodiment of FIG. 3, the current of stressed test transistors 102 and 204 can be compared to a neutral stress, test transistor current, i.e., that of second transistor 204. For example, FIG. 8 shows a chart indicating two different on-currents ($I_{on}$) for first test transistor 102 (PFET) at zero (0) degree rotation (Ion__0 deg) (tensile stress level) and for second test transistor 204 at 45° (Ion__45 deg) (neutral stress level). FIG. 9 shows a ratio Ion__0 deg to Ion__45 deg. The ratio Ion__0 deg/Ion__45 deg should be smaller and unity, and a smaller ratio indicates a higher tensile stress level. The ratio, similar to above, can be used to monitor the stress level of stress layer structure to determine the reliability and uniformity. In particular, using the ratio, any on-current ($I_{on}$) drift can be used to determine whether the drift is from the stress level of the stressed layer or from other fabrication processes. As described above, this embodiment, although not shown, can also incorporate a test transistor at 0 degrees rotation having a stressed layer opposite that of first test transistor 102, which would be formed similarly to test transistor 104B in FIG. 2. For the example described above, a PFET having a compressive stress would be added. Where the FIG. 3 embodiment includes a third test transistor, similar to test transistor 104B in FIG. 2, the ratios of Ion__0 degree for each of tensile and compressive stressed layers to Ion__45 degrees (neutral stress level) can be generated.

Figure 10:
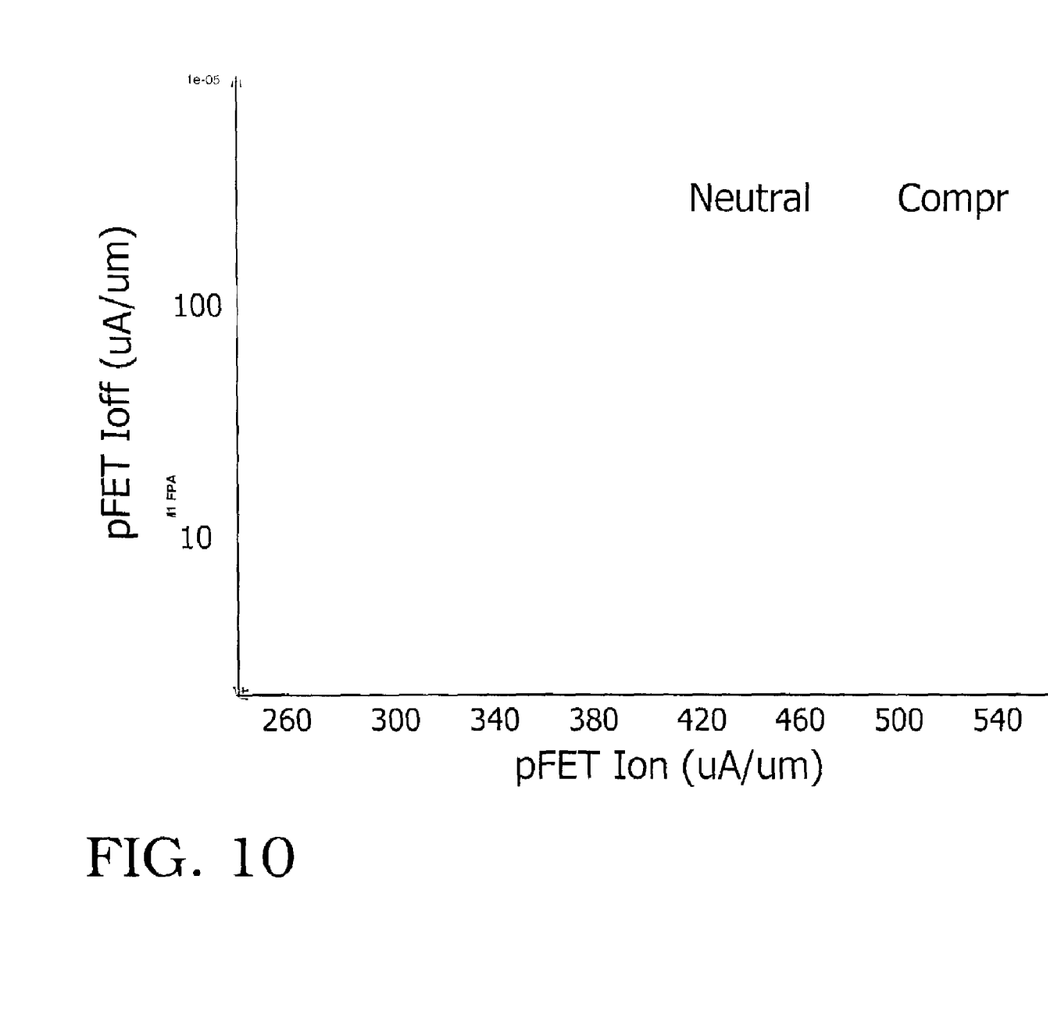
Figure 11:
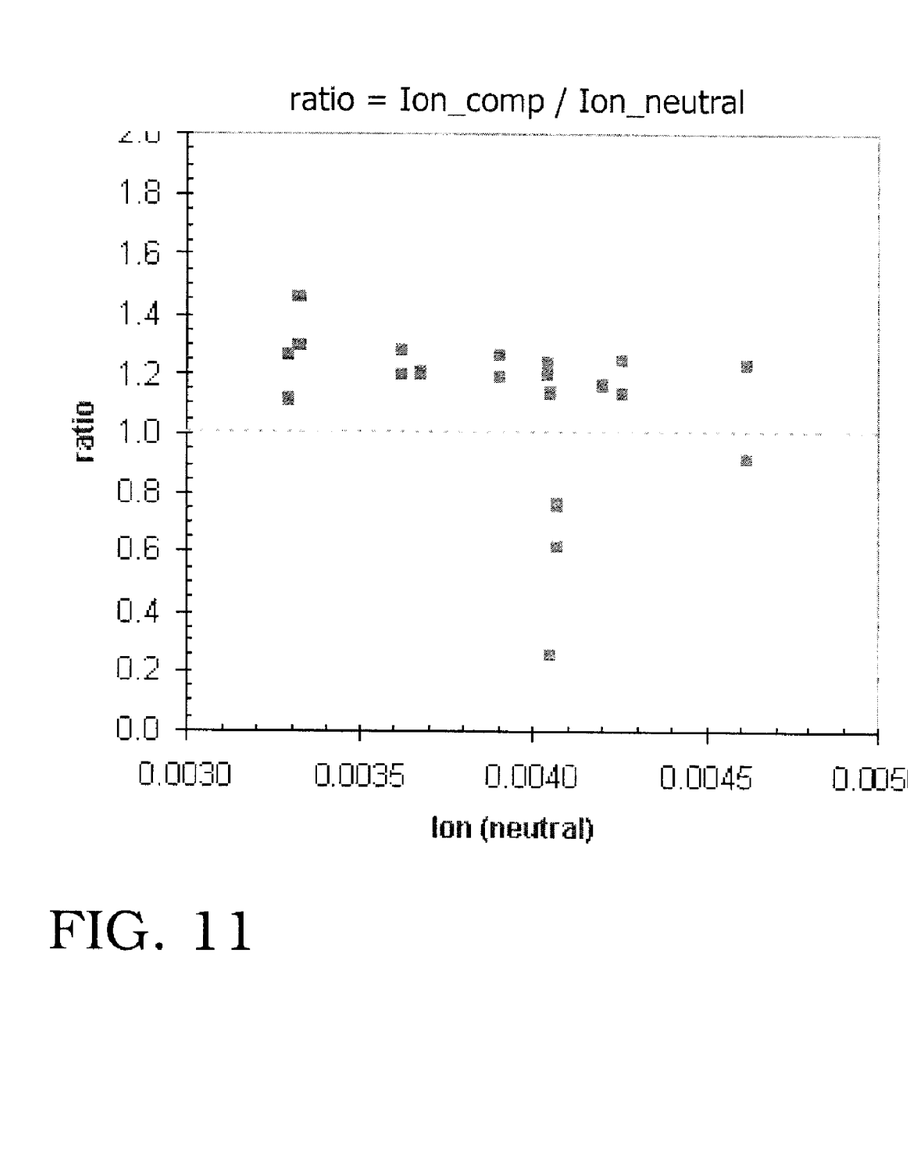

For the FIGS. 4-5 embodiment, the various currents of stressed test transistors 102 and 304, 404 can be compared to a zero stress, test transistor current, i.e., that of second transistor 304, 404. For example, FIG. 10 shows a chart indicating two different on-currents ($I_{on}$) for first test transistor 102 (compr.) in the form of an NFET having a compressive stress level and for second test transistor 304, 404 having a neutral stress level. FIG. 11 shows a ratio of Ion_compressive to Ion_neutral. The ratio, similar to above, can be used to monitor the stress level of stress layer structure to determine the reliability and uniformity. In particular, using the ratio, any on-current ($I_{on}$) drift can be used to determine whether the drift is from the stress level of the stressed layer or from other fabrication processes.

It should be recognized that while the illustrative embodiments of FIGS. 6-11 have been described using comparison of on-currents and off-currents that comparison of the other illustrative electrical parameters may also be implemented in a similar fashion. For example, comparison of overdrive linear current ($I_{odlin}$) of first test transistor 102 and the at least one second test transistor, or comparison of linear current ($I_{dlin}$) versus linear threshold voltage ($Vt_{lin}$) of first test transistor 102 and the at least one second test transistor.

An alternative embodiment of the invention includes a method of characterizing a mechanical stress level in a stressed layer of a transistor, the method comprising the steps of: providing a first test transistor 102 having a first stress level and at least one second test transistor 104A-B, 204, 304, 404 having a second stress level substantially different than the first stress level. The method may also include the step of characterizing the mechanical stress level by comparing performance of first test transistor 102 and the at least one second test transistor. As described above, the characterizing step may include: comparing on-current ($I_{on}$) versus off-current ($I_{off}$) of first test transistor 102 and the at least one second test transistor, comparing overdrive linear current ($I_{odlin}$) of first test transistor 102 and the at least one second test transistor or comparing linear current ($I_{dlin}$) versus linear threshold voltage ($Vt_{lin}$) of first test transistor 102 and the at least one second test transistor.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A mechanical stress characterizing test structure comprising:
    a first test transistor including a first stressed layer having one of a compressive stress level and a tensile stress level;
    a second test transistor having a substantially neutral stress level; and
    means for testing the first and second transistors based on their different stress levels, the test structure further comprising a third test transistor having a second stressed layer having the other of a compressive stress level and a tensile stress level, wherein the testing means test the first, second and third transistors based on their different stress levels.

2. The test structure of claim 1, wherein the testing means is configured to perform one of:
    comparing on-current (Ion) versus off-current (Ioff) of the first test transistor and the second test transistor;
    comparing overdrive linear current (Iodlin) of the first test transistor and the second test transistor; and
    comparing linear current ($I_{dlin}$) versus linear threshold voltage ($Vt_{lin}$) of the first test transistor and the second test transistor.

* * * * *